United States Patent [19]

Duforestel et al.

[11] Patent Number: 4,680,733
[45] Date of Patent: Jul. 14, 1987

[54] DEVICE FOR SERIALIZING/DESERIALIZING BIT CONFIGURATIONS OF VARIABLE LENGTH

[75] Inventors: Guy G. Duforestel, La Gaude; Michel A. Lechaczynski, Nice; Clément Y. Poiraud, Cagnes/Mer; Paul P. Viallon, Vence, all of France

[73] Assignee: International Business Machines Corporation, Armonk, N.Y.

[21] Appl. No.: 665,461

[22] Filed: Oct. 29, 1984

[30] Foreign Application Priority Data

Dec. 15, 1983 [EP] European Pat. Off. ........ 83430040.2

[51] Int. Cl.⁴ ..................... G06F 3/00; G06F 11/00; G11C 19/00
[52] U.S. Cl. ................................. 364/900; 371/25; 377/64
[58] Field of Search ... 364/200 MS File, 900 MS File; 365/73, 78; 328/105, 104, 154; 371/16, 25; 377/64

[56] References Cited

U.S. PATENT DOCUMENTS

| | | | |
|---|---|---|---|
| 3,582,902 | 12/1968 | Hirtle et al. | 364/900 |
| 3,771,133 | 11/1973 | Kashco | 364/900 |
| 3,972,031 | 7/1976 | Riemenschneider | 365/78 |
| 4,101,973 | 7/1978 | Tromp | 365/73 |
| 4,283,620 | 8/1981 | Drescher et al. | 365/78 |
| 4,429,300 | 1/1984 | Yamasawa et al. | 377/64 |
| 4,476,431 | 10/1984 | Blum | 371/25 |
| 4,597,042 | 6/1986 | d'Angeac et al. | 371/25 |

OTHER PUBLICATIONS

IBM Technical Disclosure Bulletin, vol. 19, Jun. 1976, "Selective Ring Modification with Check Pattern, by Stranko et al.
*IBM Technical Disclosure Bulletin*, vol. 24, No. 8, "LSSD Scan Technique", by Das Gupta, p. 4425 (1/1982).

*Primary Examiner*—Archie E. Williams, Jr.
*Assistant Examiner*—Lawrence E. Anderson
*Attorney, Agent, or Firm*—Robert W. Berray

[57] ABSTRACT

A serdes device includes circuitry for loading or reading bit configurations into or out of strings of latches of variable length $nk+r$, where n is the number of bits in a byte, k is the number of whole bytes and r is the number of residual bits, with r being smaller than n.

Under the control of a service processor (8), there is formed a ring comprised of the latches of the serializer/deserializer register (14), the latches of the string considered (3 or 4) and a selected number $(n-r)$ of latches of an extension register (16). The bytes to be loaded are sequentially sent to register (14), starting with the byte that contains the residual bits, and n bits are shifted out after loading each successive byte, so that after $k+1$ shifts the desired configuration will be contained in the string. For reading the contents of a string (for example, string 3), n bits are shifted, register (14) is read out, then k shifts of n bits each are performed, with register (14) being read out after each shift.

5 Claims, 13 Drawing Figures

FIG. 3
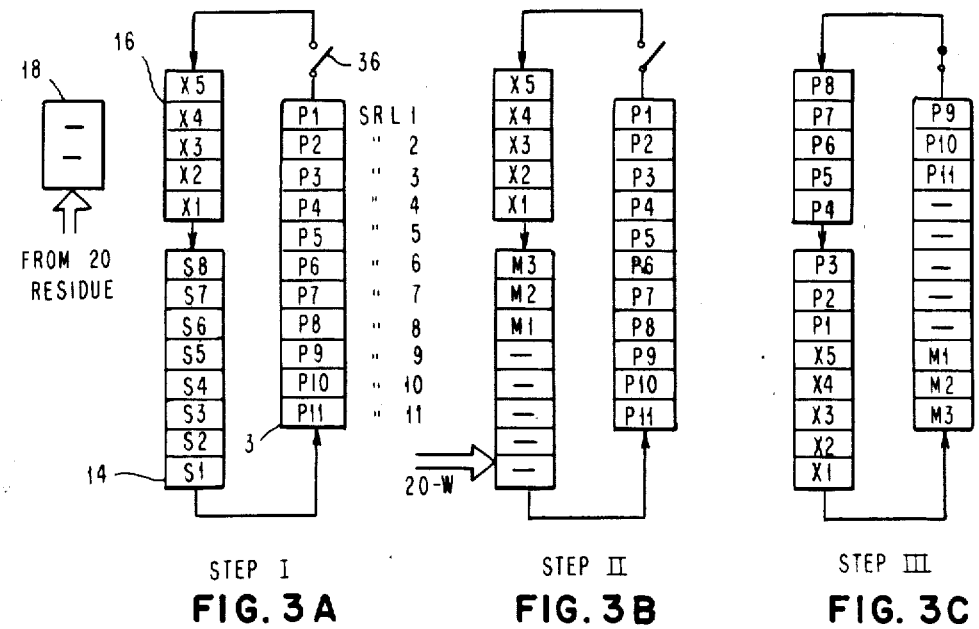
STEP I
FIG. 3A
STEP II
FIG. 3B
STEP III
FIG. 3C
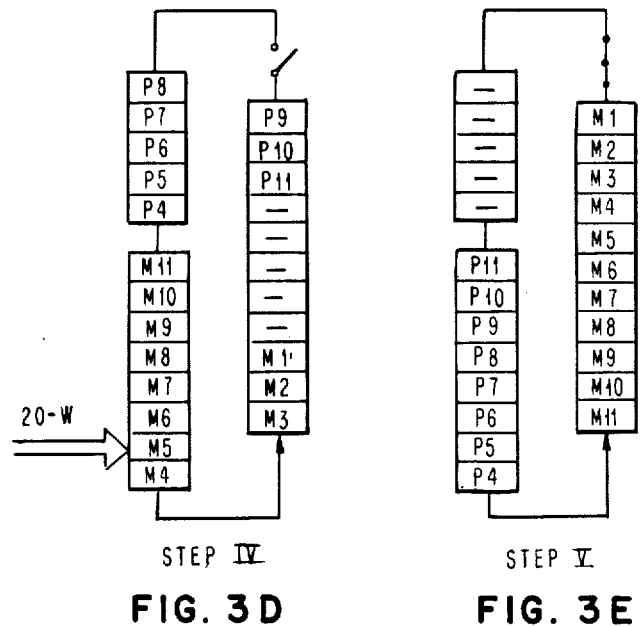
STEP IV
FIG. 3D
STEP V
FIG. 3E

DEVICE FOR SERIALIZING/DESERIALIZING BIT CONFIGURATIONS OF VARIABLE LENGTH

PRIOR ART

This invention relates to a serializer/deserializer device for writing or reading bit configurations into or out of a variable-length string of latches, and more particularly for writing or reading bit configurations into or out of strings of latches formed in a data processor to permit testing and initializing such a machine.

As mentioned in an article published in "Electronics", Mar. 15, 1979, pages 108-110, the large-scale integration of logic circuits used in such machines makes it imperative to design the circuits so as to allow tests to be conducted initially during the debugging of engineering prototype hardware, later during manufacturing and later still in the customer environment when malfunctions must be located. The Level-Sensitive Scan Design (LSSD) approach described in this article provides an easier means of testing the logic circuits and initializing the machines.

In machines which use the LSSD technique, the logic circuits are packaged on chips assembled onto cards plugged into circuit boards.

As indicated in said article, to test or to initialize a machine, bit configurations must be loaded into or read out of strings of latches forming shift registers. Each so-called shift register latch (SRL) is actually a pair of elementary latches L1, L2 connected as described in the article.

The machines are designed to allow any replaceable unit, RU, to be tested and replaced if defective. To this end, the design of the logic circuits is such that each replaceable unit, which may be a chip or a card, includes at least one string of series-connected LSSD latches to allow testing or initializing the machine. Consequently, the lengths of the strings vary according to the units in which they are located.

For example, machines which use the LSSD technique, such as the IBM 3081 Processor or the IBM System/38, include a service processor and a central processing unit (CPU). The bit configurations used for testing or initializing the machine are stored in the memory of the service processor and are loaded in the strings of latches of the CPU under the control of the service processor's control program.

An article by L. A. Stolte and N. C. Berglund entitled "Design for Testability of the IBM System/38" in the 1979 IEEE Test Conference, Digest of Papers, Oct. 23-25, 1979, pages 29-36, and the IBM Journal of Research and Development, Vol. 26, No. 1, January 1982, both describe a type of environment in which the device of the present invention can be used.

However, a problem arises as far as loading bit configurations in the strings of LSSD latches is concerned since the memory of the service processor is designed to store fixed-length bytes whereas the bit configurations to be loaded in the strings are each comprised of a number of bits that is a multiple of the byte length plus a number of residual bits (called residue hereafter) that is smaller than the number of bits comprising a byte.

Since the number of bits of the residue is variable, the bit configurations cannot be loaded in the strings of latches in a straightforward manner. Therefore, the serializer/deserializer must be capable of performing a variable number of shifts and this number must be managed by the service processor's control program, which is thereby rendered more complex. As a result, the parallel-to-serial and serial-to-parallel conversions cannot be carried out by means of simple shift registers.

It is, therefore, an object of this invention to provide a serializer/deserializer in which the number of shifts is constant regardless of the number of bits to be written or read out.

SUMMARY OF THE INVENTION

This invention relates to a serializer/deserializer device for writing or reading bit configurations into or out of strings of latches of variable length $nk+r$, where n is the number of bits in a byte, k is the number of whole bytes in the string and r is the number of residual bits, r being less than n. The device comprises a serializer/deserializer (SERDES) shift register provided with n latches that can be written into or read from, an extension register having a maximum of $(n-1)$ latches, and selection means for forming in said extension register a shift register having a number $(n-r)$ of latches that is dependent upon the length of the string. During a read or write operation, the latches of the SERDES, the latches in the string considered and the selected latches of the extension register form a ring network. A write operation is performed by loading in parallel in the SERDES the bits of a byte comprised of the residual bits, by shifting n bits in the ring, by successively loading the k bytes, and by shifting n bits after loading each of said k bytes so that, after $k+1$ shifts of n bits each, the loading of the desired bit configuration in the string will be completed.

A read operation is performed first shifting n bits in the ring and reading out the contents of the SERDES register latches, and by then performing successive shifts of n bits each and reading out the contents of the SERDES register after each of said successive shifts.

The device of the invention can be used to write (or load) and read bit configurations into and out of strings of latches formed in a data processing unit for the purpose of testing and initializing the machine. In this application, the bit configurations to be written into each string are stored in the memory of a microprocessor, a specific storage area of which is allocated to each string. In addition to the configuration of bits arranged in bytes, each area stores the binary-coded number of residual bits.

To perform either a load or a read operation, the microprocessor supplies the selection means with the number of residual bits to permit forming in the extension register the previously mentioned shift register comprising $(n-r)$ latches, and addresses the string to be selected in order to include it in the ring comprising the selected latches of the extention register and those of the SERDES register.

To perform a load operation, the microprocessor supplies by means of successive write operations the byte comprised of the residual bits and the k whole bytes, and causes a number of clock pulses to be applied, after each write operation, to the latches of the ring to effect shifts of n bits each.

To perform a read operation, the microprocessor causes a number of clock pulses to be applied to the latches in the ring to shift n bits, then reads out the contents of the SERDES register, and effects k shifts of n bits, reading out the contents of the SERDES register after each of said k shifts.

The foregoing and other objects, features and advantages of the invention will be apparent from the following more particular description of the preferred embodiments of the invention as illustrated in the drawings.

BRIEF DESCRIPTION OF THE DRAWINGS

FIGS. 3 A-E and 4 A-D show the contents of the device of FIG. 1 during a write operation and a read operation, respectively.

DETAILED DESCRIPTION OF THE INVENTION

Figure 1:
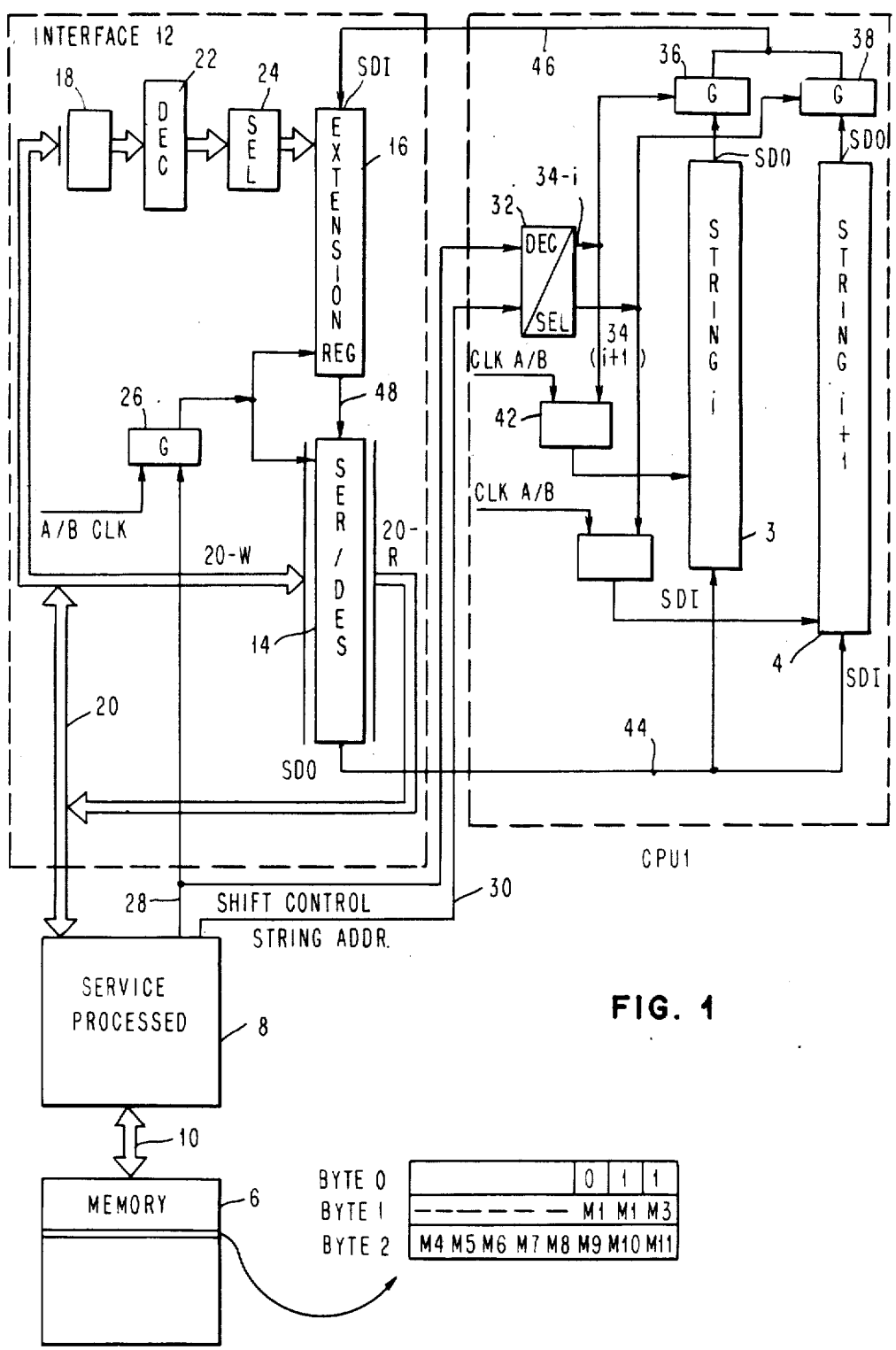
FIG. 1 illustrates the serializer/deserializer device of the invention.

The serializer/deserializer device of the invention is shown in FIG. 1. It will be assumed for the purposes of this description that the strings to be read out or written into are located in a central processing unit (CPU) 1. Two strings, i 3 and i+1 4, are shown by way of example. The length of each string is defined as nk+r; for example, the length of string i is n $k_i + r_i$, and that of string i+1 is n $k_{i+1} + r_{i+1}$, where n is the number of bits in the data bytes used in the type of machine under consideration, usually eight, $k_i$ and $k_{i+1}$ are integers greater than or equal to zero, and $r_i$ and $r_{i+1}$ are the number of bits in the residues for strings i and i+1, respectively, with $r_i$ or $r_{i+1}$ being less than n.

Figure 2:
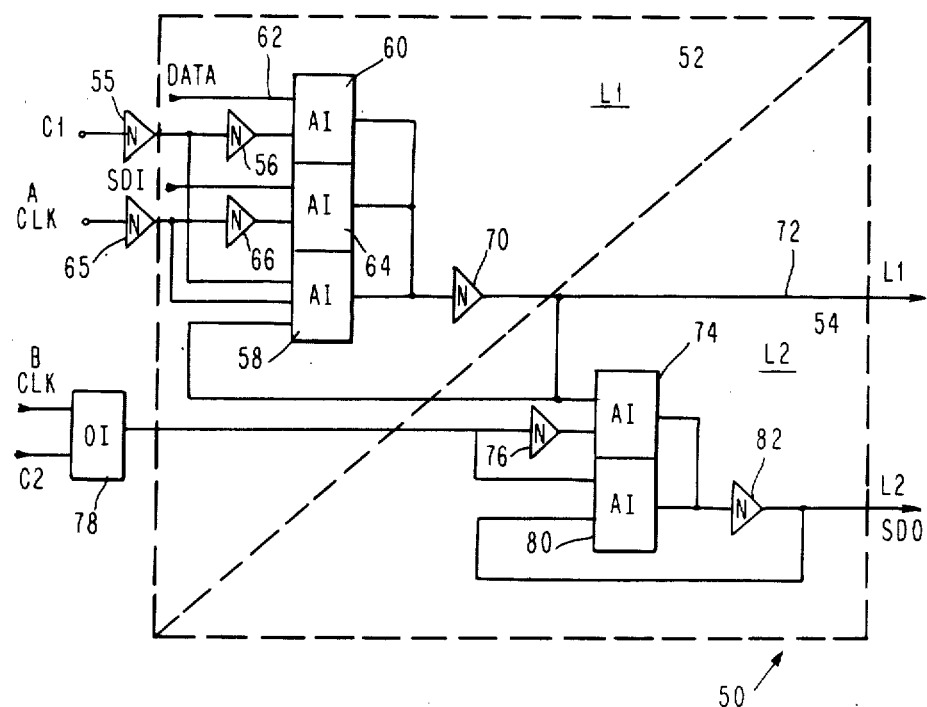
FIG. 2 illustrates a SRL that can be used to form registers 14, 16 and strings 3, 4 of the device of FIG. 1.

These strings are comprised of shift register latches (SRL) which may be of the type described in the article referred to earlier. Such a latch is shown in FIG. 2.

The configurations of bits to be loaded in each string, depending on whether it is desired to test or to initialize the machine, are stored in a memory 6 attached to a service processor 8 via a bus 10.

The serializer/deserializer device of the invention is located in the logical interface 12 between service processor 8 and CPU 1 and comprises two shift registers 14 and 16 consisting of SRLs of the same type. The first of these, SERDES register 14, has a number n of stages equal to the number n of bits in the bytes to be processed, usually eight bits, while the second, extension register 16, has (n−1) stages.

The interface further includes a register 18 that receives from the service processor, via an input/output bus 20, the number of bits in the residue for the string to be written into or read out for the purpose of a given operation. The value of the residue is decoded by a decoding circuit 22 and used by a selection circuit 24 to form in register 16 a string of latches the length of which varies according to the number of bits in the residue, as will later be explained.

Register 14 is loaded by the service processor via bus 20-W and its contents can be read out via bus 20-R.

A gate (G) 26 is activated by a shift control signal supplied by service processor 8 over line 28 to enable A and B Clock pulses to be applied to the A Clock and B Clock inputs of registers 14 and 16 (see FIG. 2).

Whenever bits are to be written into, or read out of, a given string, service processor 8 supplies a decoding and selection circuit 32 with the configuration of address bits for that string over address bus 30 and with a shift control signal over line 28.

Decoding and selection circuit 32 has two outputs, 34-i and 34-(i+1).

When active, outputs 34-i and 34-(i+1) cause gates (G) 36 and 38 to open. These gates are respectively connected to outputs SDO of the last latches in strings 3 and 4.

Output 34-i is additionally connected to a gate 40 which is activated when string 3 is selected to supply A and B clock pulses to the A and B Clock inputs of the latches in string 3.

Similarly, output 34-(i+1) is connected to a gate 42 which is activated when string 4 is selected to supply A and B clock pulses to the A and B Clock inputs of the latches in string 4.

When clock pulses are applied to the latches of registers 14 and 16 and to those of a selected string, all such latches form a ring register. To this end, output SDO of the last latch in register 14 is connected via line 44 to input SDI of the first latch in strings 3 and 4, and the outputs of gates 36 and 38 are connected via line 46 to input SDI of the first latch in extension register 16. Output SDO of the last latch in register 16 is connected to input SDI of the first latch in register 14 via line 48.

The configuration of bits to be loaded in each string to test or initialize the machine is stored in memory 8 as shown in FIG. 1. Byte O contains the number of bits r of the residue, which number is binary-coded, using a three-bit notation. In this example, in which n=8, this might be "011". Byte 1 contains the bits of the residue (M1-M3), and byte 2 contains the remaining bits, M4-M11, of the configuration. Additional whole bytes, assuming a longer configuration, could be stored after byte 2.

Each register stage comprises a SRL of the type shown in FIG. 2. An SRL is a pair of elementary latches L1 and L2, 52 and 54, each of which is comprised of AND Invert (AI) circuits and inverters (N).

Normally, latches L1 and L2 would not necessarily be required. With LSSD, however, both of these latches must be used to enable a string to be formed in the machine.

In the normal (i.e. non LSSD) mode of operation, SRL 50 is set and reset by clock pulses C1 and C2. Clock pulses C1 are applied to an inverter 55 which is connected to another inverter 56 and to an AI circuit 58.

The output from inverter 56 is applied as one input to an AI circuit 60, which also receives as another input via line 62, in the normal mode of operation (in which no test or initialization is performed), the data bit to be loaded. In the eight latches of register 14, these inputs are connected to the conductors of bus 20-W.

A Scan Data In (SDI) signal from a L2 latch 54 in a preceding stage is applied to an AI circuit 64. The A clock pulse is applied by the service processor to an inverter 65, the output of which is connected to an inverter 66 and to AI circuit 58. The outputs of AI circuits 60, 64 and 58 are connected to an inverter 70 the output 72 of which is the output L1 of latch 52. The output from inverter 70 is also applied as an input to AI circuit 58.

The output from inverter 70 is applied as one input to an AI circuit 74 in L2 latch 54. Circuit 74 has another input connected to the output of inverter 76, which receives the output from an OR Invert (OI) circuit 78. Circuit 78 receives as inputs the C2 clock signal used in the normal mode and the B clock signal used in the LSSD mode. The output from OI circuit 78 is also applied as one input to an AI circuit 80. The outputs from AI circuits 74 and 80 are applied to an inverter 82, the output from which is the output L2 of latch 54 representing the output SDO applied to the SDI input of the next SRL to form a LSSD string.

In the normal mode, the bits stored in the L1 and L2 latches, 52 and 54, when the C1 and C2 clock pulses have been applied, are identical. However, in the LSSD mode, in which the SRL forms a single stage of a shift register, the C1 and C2 clock pulses are no longer applied, but the A and B clock pulses are respectively fed to the L1 and L2 latches, 52 and 54, to cause the bits to be shifted in the string formed between the SDI input of the first latch and the SDO output of the last latch in the string.

Referring now to FIGS. 1 and 3, the manner in which a string such as string 3 is loaded with the eleven-bit configuration M1-M11 shown in FIG. 1 will be described.

STEP I

Service processor 8 supplies register 18, by means of a first programmed I/O operation PIO 1 initiated by the control program, with the number of bits in the residue, that is, "011" in this example, contained in byte O stored in the storage area allocated to string 3, for the purpose of a test or an initialization. Decoding and selection circuit 22 defines in register 16 a string of five latches (8-3) that are series-connected in the ring comprising register 14 and the latches of the selected string. The address of that string is sent over bus 30.

The contents of the latches in the ring thus formed are shown in FIG. 3A.

STEP II

A second PIO operation, PIO 2, is performed whereby the bits of byte 1 are loaded in parallel in register 14 through bus 20-W, the conductors of which are connected to the Data inputs of the latches of the register. The contents of the latches in the ring are as shown in FIG. 3B.

STEP III

The service processor sends a "shift 8 bits" command on line 28, causing eight A and B clock pulses to pass through gates 26 and 40 and inhibiting gate 36. The contents of the latches in the ring at this time are as illustrated in FIG. 3C. As shown, the three bits of the residue are now in the last three latches of string 3, namely SRL 9, SRL 10 and SRL 11.

STEP IV

A third PIO operation, PIO 3, is performed to load the bits of byte 2 (M4-M11) in parallel into register 14. Gates 36 and 40 are open. The contents of the latches in the string are as shown in FIG. 3D.

STEP V

The service processor sends another "shift 8 bits" command on line 28, inhibiting gates 26,40 and 36 and causing eight A and B clock pulses to be applied to the latches in the ring. The contents of the latches are as illustrated in FIG. 3E. As shown, the eleven bits, M1-M11, have been loaded in string 3 by means of 8-bit shifts only.

If it is desired to load longer strings and if it is necessary to send additional whole bytes, then such bytes should be successively loaded in register 14 and eight bits should be shifted after loading each byte.

Extension register 16 must always have a number of stages such that the last shift of eight bits will enable the non significant bits contained in byte 1 to be eliminated from the selected string.

If the string comprises k bytes of n bits plus a residue of r bits, then the string will be loaded by first forming an extension register 16 of n-r bits, by then loading byte 1, containing the bits of the residue, in n-stage register 14 and shifting n bits, and by successively loading the next k bytes in register 14, causing n bits to be shifted after loading each of said k bytes.

Figure 4:
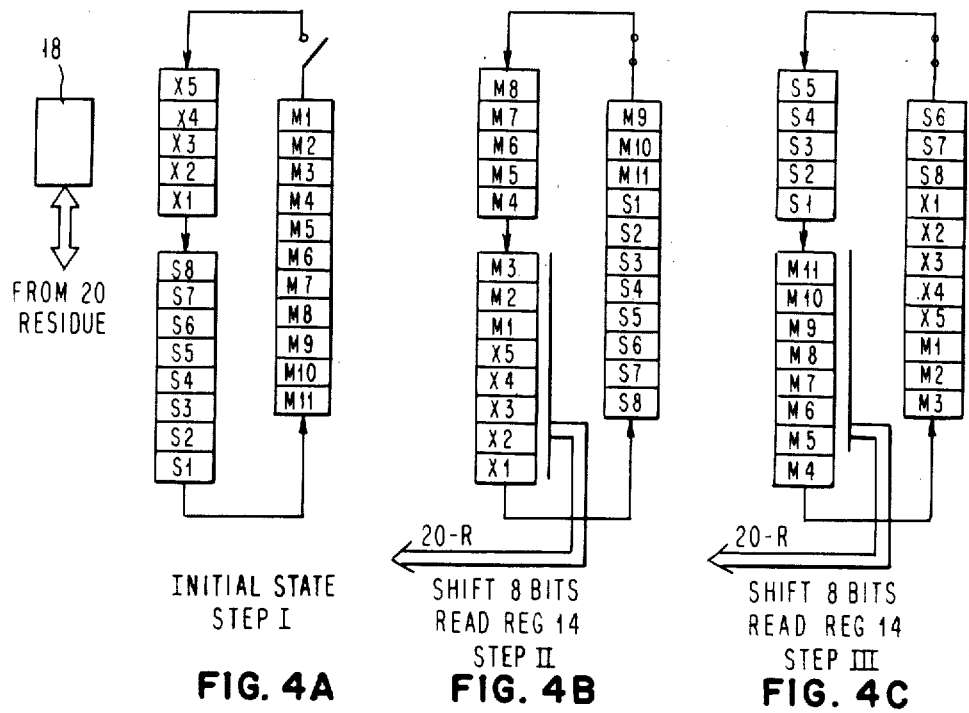
Figure 4:
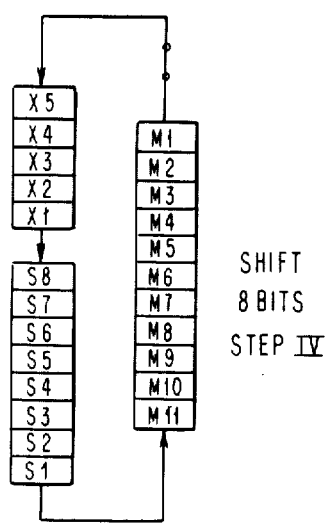

Referring now to FIGS. 4 A-D, the steps to be performed to read out a selected string, such as 11-bit string 3, are shown.

STEP I

The service processor causes byte O, stored in the storage area allocated to the selected string, to be transferred to register 18 to form an extension register the length of which is dependent on the value of the residue, that is, a 5-stage register in this example. The address of the selected string is sent over bus 30. During these various operations, a ring will be formed between the latches of extension register 16, of register 14 and of the selected string, the initial contents of which are shown in FIG. 4A.

STEP II

An 8-bit shift is performed in the ring, with gates 26, 36 and 40 being inhibited by the shift control signal sent over line 28. A first PIO operation, PIO 1, is next carried out to read the contents of register 14 which are transferred to the microprocessor via bus 20-R (see FIG. 4B).

STEP III

A second 8-bit shift is performed and the contents of register 14 are then read out by the microprocessor by means of a second PIO operation, PIO 2.

STEP IV

An additional 8-bit shift may be performed to reconstruct the initial values in the selected string, so that the bit configuration will not be lost therein (FIG. 4D).

Figures 5, 5A:
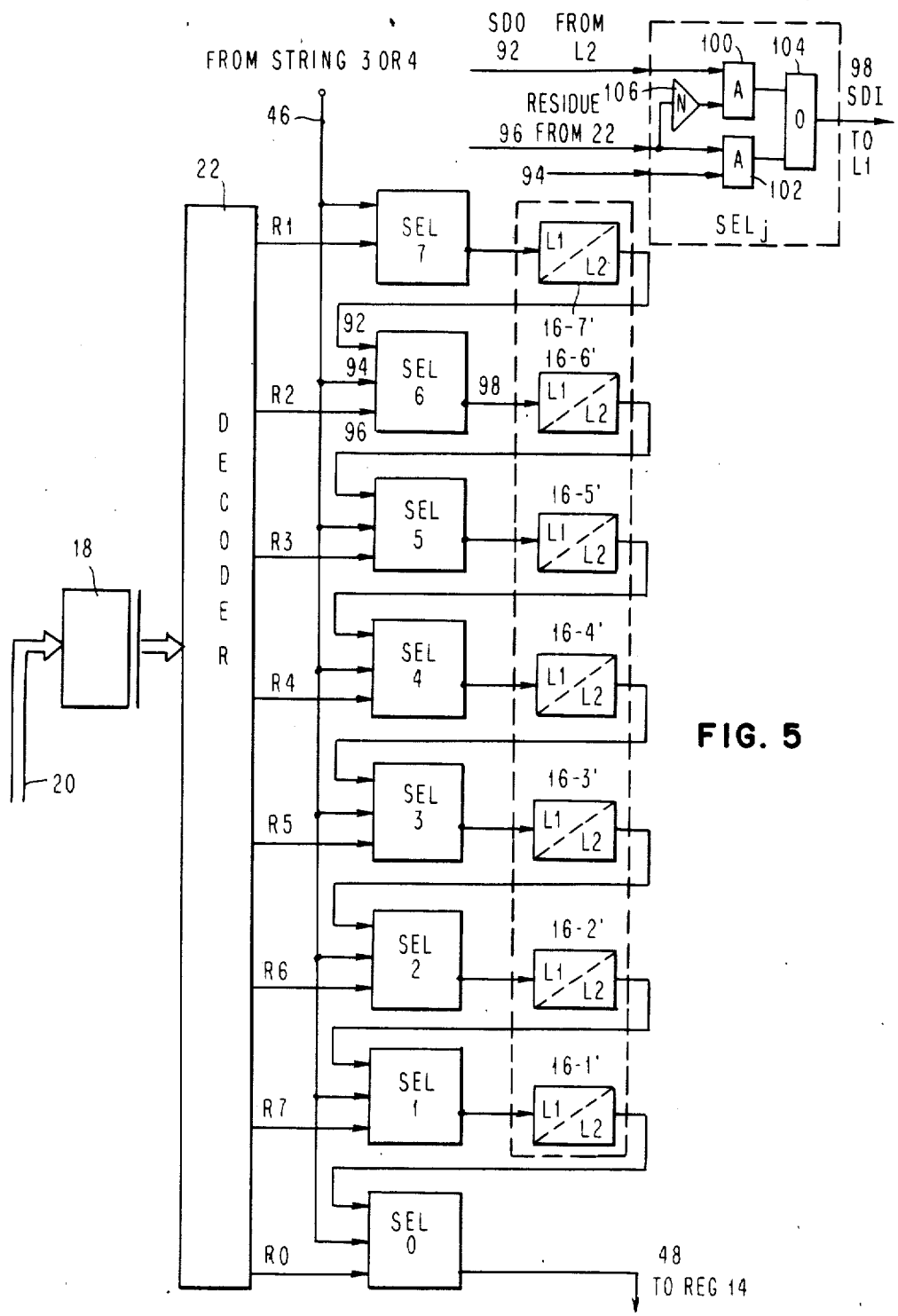
FIG. 5 shows selection circuit 24 and extension register 16 of FIG. 1.

Referring now to FIG. 5, there is shown the selection circuit 24 that is used to form an extension register comprising the required number of stages, this number being dependent on the value of the residue.

The value of the residue for the string selected to perform a read or write operation is written into register 18. This value is decoded in a conventional manner by decoder 22, which includes true/complement value generators and AND gates connected to the outputs thereof so that the logic level present on each output line, R0-R7, of the decoder will indicate the value of the residue. For example, a high level level on output line R3 will indicate that the residue had a value of three bits, low logic levels being present on all other output lines.

Seven selection circuits. SEL 0-SEL 7, are connected to the outputs of the decoder. The logic diagram of a selection circuit is shown in FIG. 5A.

Output R0 is connected to circuit SEL 0, output R7 to circuit SEL 1, output R6 to circuit SEL 2, etc, and output R1 to circuit SEL 7.

Register 16 comprises seven SRLs of the type shown in FIG. 2. Input SDI of latch 16-7 is connected to output 90 of circuit SEL 7 and output SDO of the same latch is connected to an input 92 of circuit SEL 6. Each latch is connected in the same manner to the associated selection circuit.

Another input 94 of each selection circuit is connected to line 46 to form, at the time a selected string is to be written into or read out, the ring shown in FIGS. 3 and 4.

Input 96 of circuit SEL 6 is connected to output R2 of decoder 22, and its output 98 is connected to input SDI of latch 16-6.

Each selection circuit includes two AND gates 100 and 102, an OR gate 104 and an inverter 106.

AND gate 102 is connected to inputs 96 and 94. AND gate 100 is connected to input 92 and, via inverter 106, to input 96.

AND gates 100 and 102 have their outputs connected to the inputs of OR gate 104, the output of which is the output 98 of the selection circuit.

The operation of the circuit is as follows. Assume that the value of the residue in register 18 is "010". A high logic level is present on output line R2 of the decoder while the logic level on all other output lines is low.

Accordingly, AND gate 102 in circuit SEL 6 is open and the data bits on input 94 are transferred to output 98. In the other circuits, SEL 5 to SEL 0, gate 102 is inhibited but gate 100 is open and thus latches 16.5 to 16.1 are series-connected so that the bits from line 46 can be stored therein and shifted when clock pulses are applied to the latches in the ring.

When the residue is zero, none of the latches of register 16 is selected and the bits on line 46 are directly fed to the first latch of register 14.

The serializer/deserializer device of the invention has been shown and described in the context of a machine using the LSSD technique because many read and write operations would be performed therein and would require that the bits in storage be serialized to be written into selected LSSD strings and that bits read from selected LSSD strings be deserialized in order to be stored. However, it will be apparent that the device can be used in all applications wherein bits are to be written into or read out of variable-length registers.

While the invention has been shown and described with reference to a preferred embodiment thereof, it will be understood by those skilled in the art that various changes in form and detials may be made therein without departing from the spirit and scope of the invention.

Having thus described our invention, what we claim as new and desire to secure by Letters Patent is:

1. A serializer/deserializer device for loading bit configurations comprising strings of latches of variable length nk+r, where n is the number of bits in a byte, k is the number of whole bytes in the string, and r is the number of residual bits, with r being smaller than n, and n being greater than 1, characterized said serializer/deserializer device in that it further comprises:

a serializer/deserializer (SERDES) shift register (14) having n latches that can be loaded in parallel, an extension register (16) having (n−1) latches, said extension register and said SERDES shift register being connected in series;

selection means (18, 22, 24) for forming in said extension register a shift register the number of selected latches of which will vary dependent upon the length of the string of such that the number of selected latches is equal to (n−r), means (36, 38, 46, 48, 44, 32) for interconnecting the latches of the SERDES register, those of the string of latches, and ones of the extension register latches selected by said selection means to form a register, such that bits can be circulatorily shifted serially from said SERDES shift register and said extension register to said string of latches;

means (6, 8, 20-W) for sequentially writing into the SERDES register the bytes to be loaded in the string of latches, and clock and writing means (26, 40, 20-W) for selectively applying to the latches in said ring network clock pulses causing the bits in the ring network to be shifted, to load in parallel in the SERDES register the byte that includes the residual bits, in the low order bit positions of the byte cause n bits to be shifted in the ring network, load the k bytes in succession in the SERDES shift register, and cause n bits to be shifted after loading each byte.

2. A device according to claim 1, used to read bits contained in a string of latches of length nk+r, characterized in that it comprises means (8, 20-R) for reading out the contents of the SERDES register, the bits contained in the string of latches being read out by performing a first shift of n bits in the ring register comprising the latches of the SERDES register, the string of latches to read out and (n−r) latches of the extension register, by reading out the contents of the latches in the SERDES register, by causing k successive shifts of n bits to be performed, and by reading out the contents of the SERDES register after each shift of n bits.

3. A device according to claim 2, characterized in that it is used for writing and reading data into and out of strings of latches formed in a data processing unit in order to test and initialize said unit.

4. A device according to claim 3, characterized in that said means for writing and reading bytes into and out of the SERDES register include a microprocessor (8) associated with a memory (6) an area of which is allocated to each string of the unit for storing the outgoing bit configurations arranged into bytes as well as the number of residual bits relating to the string, said microprocessor comprising:

an input/output bus (20) through which the bits stored in the memory are transferred to the SERDES register by means of a write operation, the bits stored in the SERDES register are transferred to the microprocessor by means of a read operation, and the number of residual bits is sent to the selection means to select the (n−r) latches of the extension register, a string address line (30) for interconnecting the selected string of latches, the SERDES register and the selected latches of the extension register to form a ring register, and a shift control line (28) for causing the number of clock pulses required to effect n-bit shifts to be applied at appropriate times to the latches in the ring register formed after a string of latches has been addressed.

5. A device according to any one of claims 2 to 4, characterized in that the selection means includes:

a register (18) into which the number of residual bits for the string to be loaded or read out is written, a decoding circuit (22) for decoding the contents of said register, said circuit having n outputs (R0 to R7) and generating an active signal on one of the outputs depending on the contents of the register, and selection logic (FIG. 5A) that receives the outputs from the decoding circuit (22) to cause (n−r) latches of the extension register to be connected in series.

* * * * *